(12) United States Patent
Aoki et al.

(10) Patent No.: US 6,313,632 B1
(45) Date of Patent: Nov. 6, 2001

(54) MAGNETIC FIELD GENERATOR FOR MRI, PACKING MEMBER FOR THE SAME, AND METHOD FOR PACKING THE SAME

(75) Inventors: Masaaki Aoki, Takatsuki; Shigeo Hashimoto, Nishinomiya, both of (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/302,190

(22) Filed: Apr. 30, 1999

(30) Foreign Application Priority Data

Jun. 19, 1998 (JP) .................................................. 10-189717

(51) Int. Cl.[7] ...................................................... G01V 3/00
(52) U.S. Cl. .............................................................. 324/318
(58) Field of Search .............................................. 324/318

(56) References Cited

U.S. PATENT DOCUMENTS 5,003,276 * 3/1991 Sarwinski et al. .................... 335/304
5,490,509 * 2/1996 Carlson et al. ....................... 324/318

FOREIGN PATENT DOCUMENTS

| 0 314 262 | 5/1989 | (EP) . |
| 0 760 484 | 3/1997 | (EP) . |
| 3-39139 | 2/1991 | (JP) . |
| 4-246330 | 9/1992 | (JP) . |
| 6-54819 | 3/1994 | (JP) . |
| WO 84/00611 | 2/1984 | (WO) . |

OTHER PUBLICATIONS

Stewart C. Bushong, Magnetic Resonance Imaging Physical and Biological Principles second edition, 1996.*

* cited by examiner

Primary Examiner—Hezron Williams
Assistant Examiner—Dixomara Vargas
(74) Attorney, Agent, or Firm—Armstrong, Westerman, Hattori, McLeland & Naughton, LLP (57) ABSTRACT

A magnetic field generator for an MRI includes a generator main body. The generator main body includes a pair of plate yokes opposed to each other with space in between, a permanent magnet disposed in each of the opposed surfaces of the plate yokes, and a column yoke for magnetically connecting the plate yokes. As a packing member, a shielding member, and if necessary, a stud pin as well as a fixing member are prepared. When packing, the shielding member is attached to the generator main body for shielding an opening. The stud pin may be used for providing a gap between the generator main body and the shielding member. For an open-type generator, the fixing member should preferably be attached to bridge the pair of plate yokes at a middle portion of the opening.

10 Claims, 9 Drawing Sheets

MAGNETIC FIELD GENERATOR FOR MRI, PACKING MEMBER FOR THE SAME, AND METHOD FOR PACKING THE SAME

BACKGROUND OF THE INVENTION

1. Field of the Invention

The present invention relates to a magnetic field generator for an MRI, a packing member for the magnetic field generator for the MRI, and a method for packing the magnetic field generator for the MRI. More Specifically, the present invention relates to a magnetic field generator for MRI incorporating permanent magnets, a packing member for such a magnetic field generator for MRI, and a method for packing said magnetic field generator for MRI.

2. Description of the Prior Art

Figure 11:
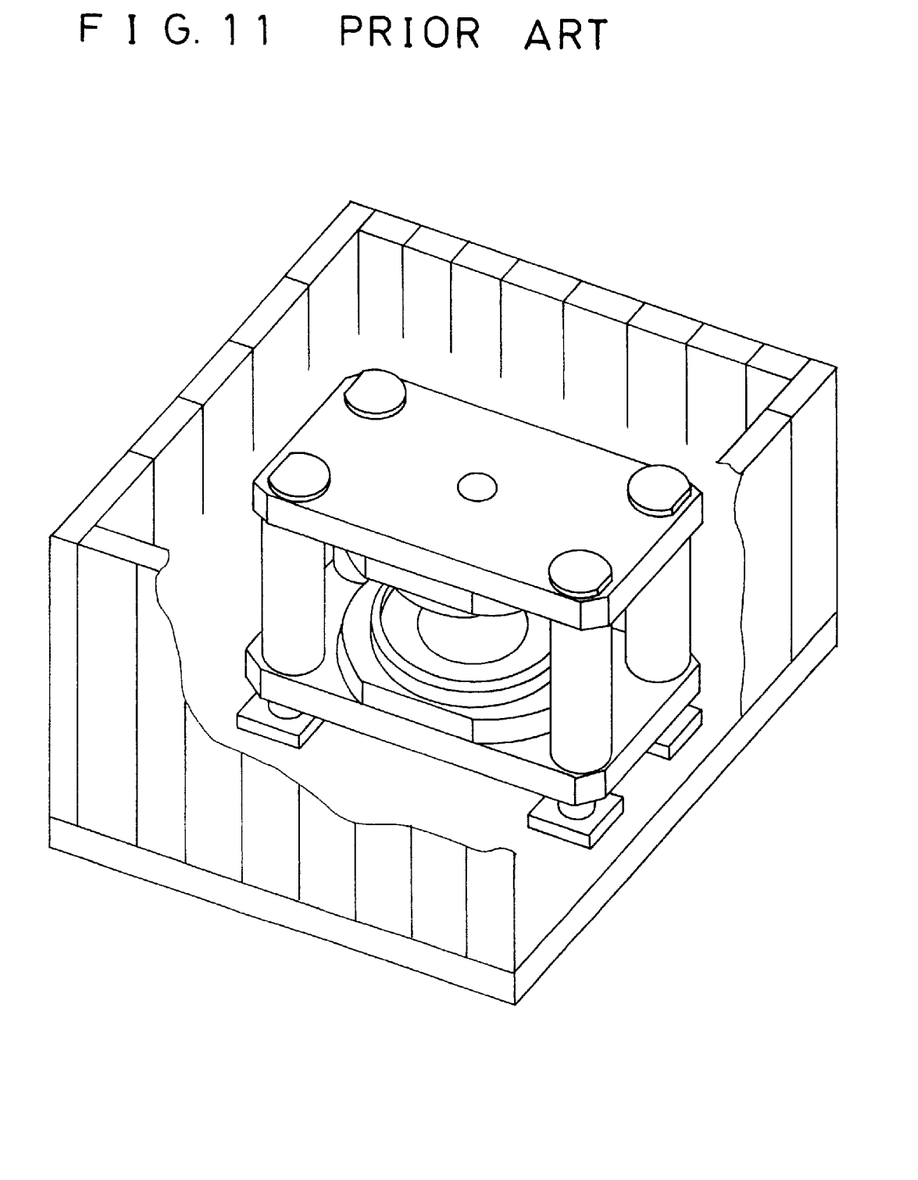
FIG. 11 is a perspective view showing a prior art.

A magnetic field generator for MRI using permanent magnets is becoming popular in recent years. The magnets used in such an apparatus have a very strong magnetism. For this reason, the magnetic field generator for MRI must be protected during transportation so that no magnetic objects such as tools are drawn into a magnetic circuit built in the magnetic field generator. Typically, the entire magnetic field generator is concealed into a wooden box during the transportation as shown in FIG. 11.

However, packing the entire magnetic field generator is a major, time-consuming job.

Another trend in the recent years is that an increasing number of magnetic field generators for MRI have an open type structure in which the number of column yokes are decreased for improved psychological comfort of a patient. In this open type magnetic field generator however, even a very small misalignment (such as 0.05 mm) between an upper plate yoke and a lower plate yoke will result in an ununiform magnetic field, adversely affecting an image obtained by the MRI apparatus.

A problem is that this open type magnetic field generator for MRI is so heavy (typically 15 tons), that an open region of the generator main body can be easily deformed by craning operation or by vibration during transportation. This results in dimensional changes in the magnetic circuit (particularly in a distance between upper and lower pole pieces), deteriorating the uniformity of the magnetic field. Therefore, after arriving at a site of installation, a long time has to be spent for re-adjusting the uniformity of the magnetic field.

SUMMARY OF THE INVENTION

It is therefore a primary object of the present invention to provide a magnetic field generator for MRI, a packing member for the magnetic field generator for MRI, and a method for packing the magnetic field generator for MRI, for simplified packing.

Another object of the present invention is to provide a magnetic field generator for MRI, a packing member for the magnetic field generator for MRI, and a method of packing the magnetic field generator for MRI, for simplified re-adjustment of the uniformity of the magnetic field.

According to an aspect of the present invention, there is provided a magnetic field generator for MRI comprising: a generator main body including a pair of plate yokes opposed to each other with space in between, a magnet disposed in each of the opposed surfaces of the pair of plate yokes, and a column yoke for magnetically connecting the plate yokes; and a packing member provided at an opening formed by the pair of plate yokes and the column yoke.

According to another aspect of the present invention, there is provided a packing member for a magnetic field generator for MRI, the magnetic field generator for MRI comprising a generator main body including a pair of plate yokes opposed to each other with space in between, a magnet disposed in each of the opposed surfaces of the pair of plate yokes, and a column yoke for magnetically connecting the plate yokes; wherein the packing member includes a shielding member provided at an opening formed by the pair of plate yokes and the column yoke.

According to still another aspect of the present invention, there is provided a packing member for a magnetic field generator for MRI, the magnetic field generator for MRI comprising a generator main body including a pair of plate yokes opposed to each other with space in between, a magnet disposed in each of the opposed surfaces of the pair of plate yokes, and a column yoke for magnetically connecting the plate yokes; wherein the packing member includes a fixing member for bridging the pair of plate yokes.

According to another aspect of the present invention, there is provided a method for packing a magnetic field generator for MRI, the magnetic field generator for MRI comprising a generator main body including a pair of plate yokes opposed to each other with space in between, a magnet disposed in each of the opposed surfaces of the pair of plate yokes, and a column yoke for magnetically connecting the plate yokes: wherein the method comprises; the first step of preparing a packing member, and the second step of providing the packing member at an opening formed by the pair of plate yokes and the column yoke.

According to the present invention, a shielding member, as well as a stud pin and a fixing member if necessary, are prepared as packing members for packing the magnetic field generator for MRI.

When packing, the shielding member is attached to the generator main body for shielding an opening formed by the pair of plate yokes and a column yoke so that no magnetic objects are drawn inside the magnetic field generator while the magnetic field generator is being transported. With the above arrangement, only necessary portions of the generator main body may be covered, and therefore it becomes easier to pack the magnetic field generator for MRI.

If the shielding member is to be attached within a strong magnetic field, the shielding member is not directly attached to the generator main body. Instead, an end portion of the gap providing member is attached to the generator main body, making the gap providing member protrude laterally outwardly of the generator main body so that the shielding member is attached to another end of the gap providing member. By providing such a gap between the generator main body and the shielding member, it becomes possible to prevent the problem that magnetic objects such as a tool left outwardly of the shielding member is drawn inside by the strong magnetism.

Further, the fixing member may be attached to bridge the pair of plate yokes at a center portion of the opening for example. By such an arrangement, it becomes possible to hold in place the pair of plate yokes opposed to each other at a high precision. Thus, the magnetic circuit of the magnetic field generator for MRI can be well protected from dimensional change during transportation for example, and as a result, the uniformity of the magnetic field of the magnetic field generator for MRI can be easily re-adjusted. This advantage is particularly significant in the open type magnetic field generator for MRI.

DETAILED DESCRIPTION OF THE PREFERRED EMBODIMENTS

Now, embodiments of the present invention will be described with reference to the accompanying drawings.

Figure 1:
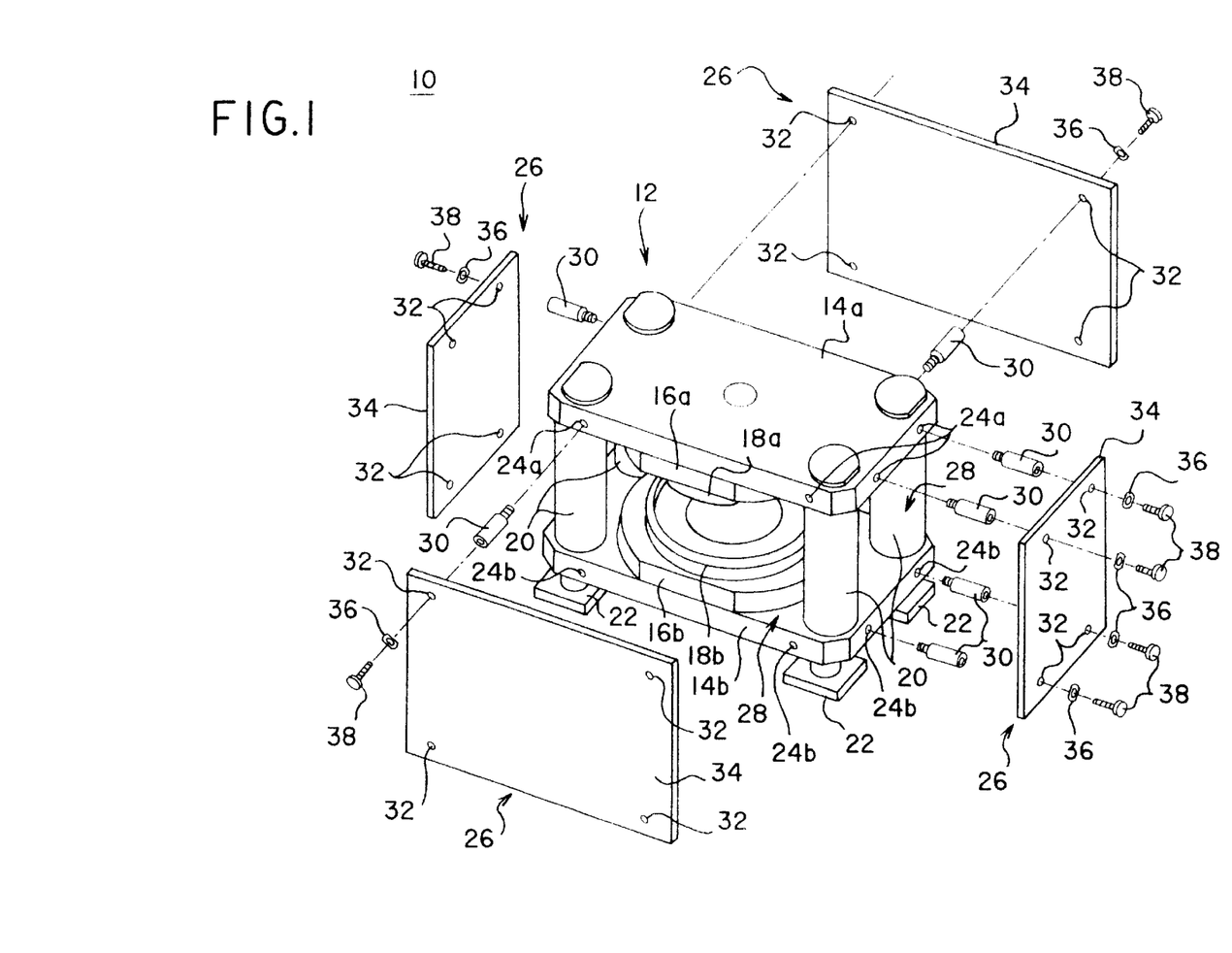
FIG. 1 is a perspective explosive view of an embodiment of the present invention, showing a state before packing.

FIG. 1 shows a magnetic field generator for MRI 10 as an embodiment of the present invention.

The generator 10 comprises a generator main body 12. The main body 12 includes a pair of plate yokes 14a, 14b opposed to each other with space in between. Each of the plate yokes 14a, 14b is generally rectangular, having the opposing surface provided with a permanent magnet 16a or 16b. The permanent magnets 16a, 16b are opposed to each other, and each of the opposing surfaces is fixed with a pole piece 18a or 18b.

The plate yokes 14a, 14b are magnetically connected with each other by four cylindrical column yokes 20. Further, the plate yoke 14b has a lower surface having four corner portions each provided with a leg portion 22.

The plate yoke 14a has side surfaces each formed with a pair of threaded holes 24a. Likewise, the plate yoke 14b has side surfaces each formed with a pair of threaded holes 24b.

When packed, the main body 12 is attached with packing members 26.

Each of the packing members 26 is prepared uniquely to a corresponding opening 28 formed by the pair of plate yokes 14a, 14b and column yokes 20 of the main body 12. According to this embodiment, a total of four packing members 26 are prepared corresponding to a total of four openings 28.

It should be appreciated that in order to avoid complexity FIG. 1 does not show every piece of components. Each of the packing members 26 includes stud pins 30 as gap providing members, a shielding member 34 as a rectangular panel formed with holes 32, washers 36, and fixing bolts 38. The shielding member 34 may be made of a low cost material such as plywood having a thickness of about 10 mm for example. The shielding member 34 should preferably have a vertical dimension not smaller than a distance between the pair of plate yokes 14a and 14b. The same applies to other shielding members to be described later; i.e. each of the shielding members should preferably have a vertical dimension not smaller than the distance between a corresponding pair of plate yokes.

Figure 2:
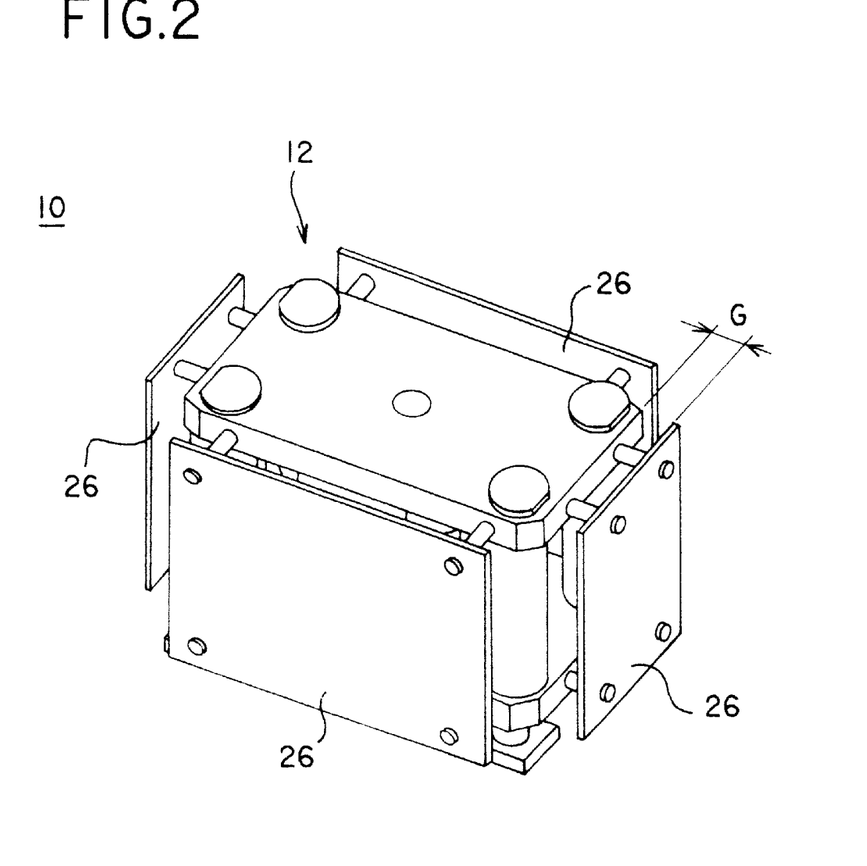
FIG. 2 is a perspective view of the embodiment in FIG. 1, showing a state after the packing.
Figure 3:
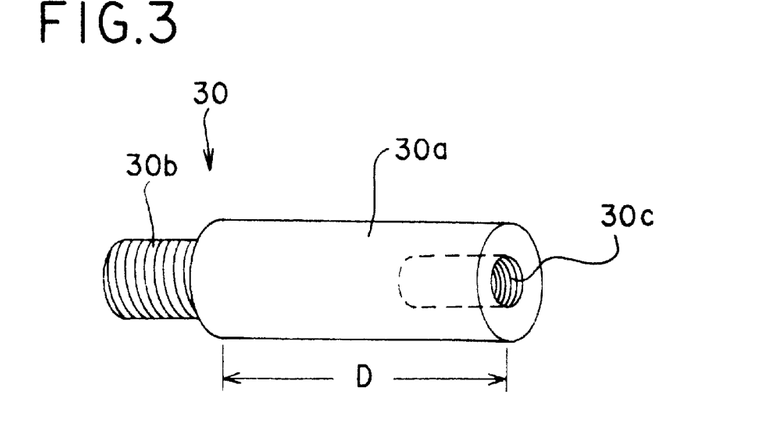
FIG. 3 is an illustration showing an example of a stud pin.

The stud pins 30, holes 32, washers 36, and fixing bolts 38 included in each of the packing members 26 are prepared respectively to fit the corresponding threaded holes 24a, 24b. According to this embodiment, a set of four of each is prepared per the packing member 26. As shown in FIG. 3, the stud pin 30 includes a shaft portion 30a for providing a gap G (See FIG. 2) between the shielding member 34 and the main body 12, a threaded portion 30b formed at one end of the shaft portion 30a, and a threaded hole 30c formed at another end of the shaft portion 30a. Dimension D of the shaft portion 30a provides the dimension of the gap G.

The packing members 26 prepared as above are attached to the main body 12 in the following steps.

Specifically, the threaded portion 30b of each stud pin 30 is threaded into the corresponding threaded hole 24a, 24b of the plate yokes 14a, 14b, so that each of the stud pins 30 is fixed to a side surface of the plate yokes 14a, 14b. Then, each of the holes 32 of the shielding members 34 is aligned with a corresponding threaded hole 30c of the stud pin 30. Finally, each of the fixing bolts 38 is inserted into one of the washers 36, the corresponding hole 32 of the shielding member 34, and threaded into the threaded hole 30c of the stud pin 30. Thus, each of the packing members 26 is attached to the main body 12, completing the packing of the magnetic field generator for MRI. In this state, as shown in FIG. 2, all of the openings 28 of the generator 10 are shielded by respective shielding members 24, i.e. the packing members 26, being protected so that no magnetic objects such as a tool can enter the generator 10 while the generator 10 is transported.

Figure 4:
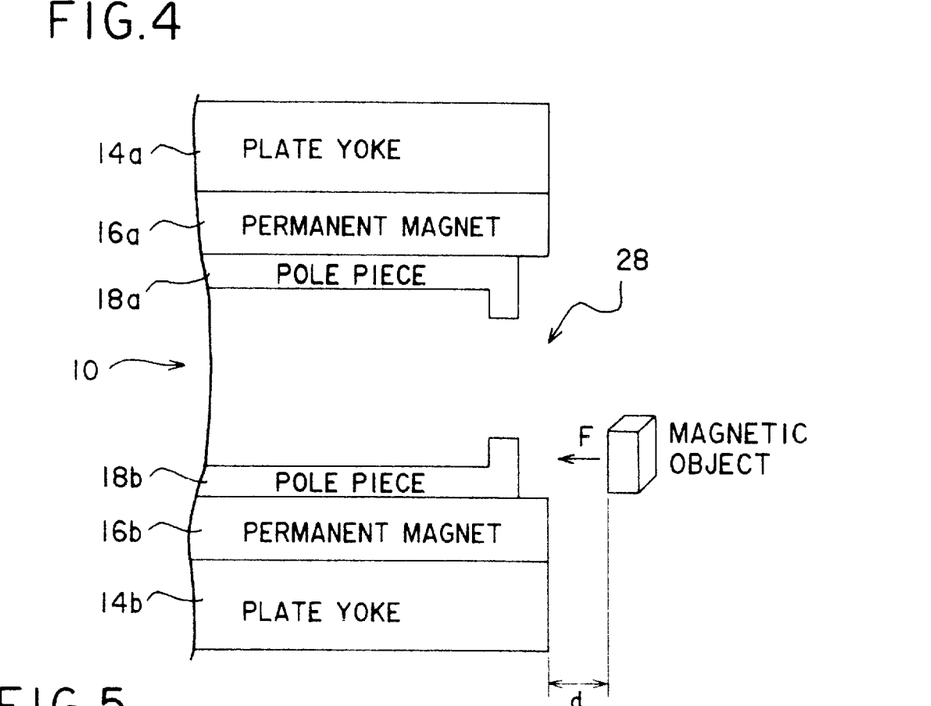
FIG. 4 is an illustration showing the distance d between a magnetic field generator for MRI and a magnetic member.
Figure 5:
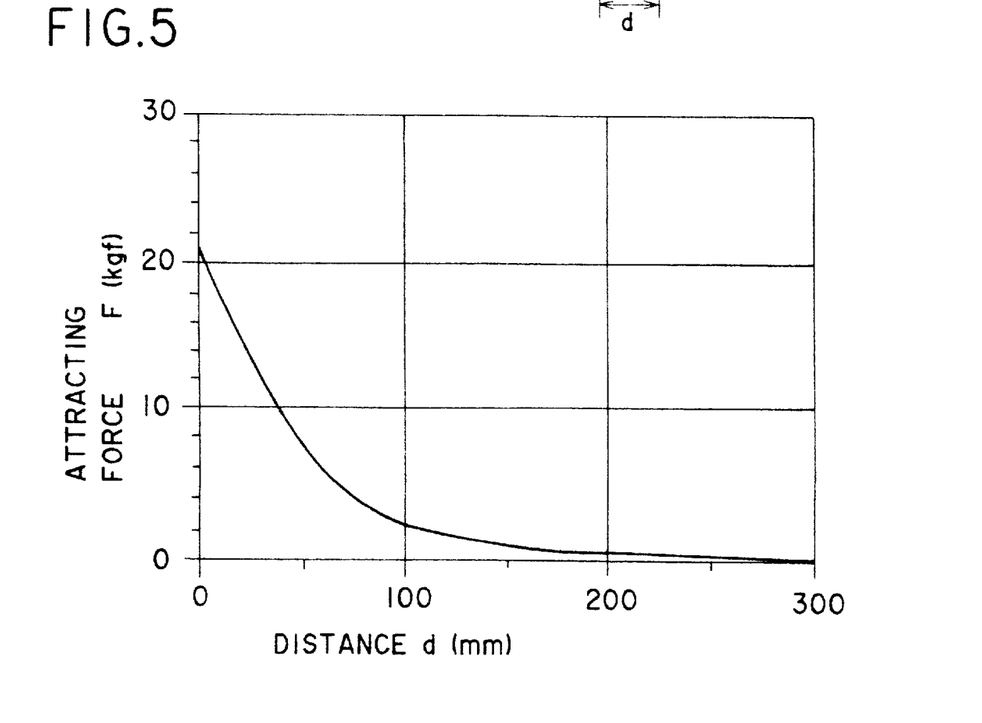
FIG. 5 is a graph showing a relationship between the distance d and attracting force F.

The graph in FIG. 5 shows a relationship between the distance d and the attracting force F exerted by the generator 10 to a magnetic object. In this graph, the distance d represents the distance from the generator 10 to a magnetic object as shown in FIG. 4. The graph takes a case in which the magnetic object is a piece of steel (such as a tool) of a size 5 cm×5 cm×10 cm (weighing approximately 2 kg.)

As will be understood from FIG. 5, the attracting force F rapidly decreases when the magnetic object is moved away from the generator 10. Thus, if the attracting force F of 10 kgf or less is desirable for example, a distance of approximately 50 mm or more must be provided. Using such a guideline, if the shielding member 34 is to be attached within a very strong magnetic field, the dimension D of the shaft portion 30a is given a specific length to make the gap G between the main body 12 and the shielding member 34 wide enough at least to prevent the magnetic object placed outward of the shielding member 34 from being drawn by the generator 10.

According to the above magnetic field generator for MRI 10, packing is complete simply by shielding the necessary portions of the main body 12. The number of packing steps is decreased, and the packing operation becomes easier. Thus, it becomes possible to reduce the time necessary for packing operation, which conventionally is almost half a day, to approximately 30 minutes. Likewise, the time necessary for unpacking is also reduced remarkably.

In addition to the fact that the packing operation becomes easier, the amount of material necessary for the packing can be reduced. Specifically, packing cost which is about 200,000 yen to 300,000 yen according to the prior art is now reduced to 40,000 yen to 50,000 yen, achieving a significant cost reduction. Further, the volume of the generator 10 as packed is now smaller than according to the prior art, resulting also in reduced cost of the transportation.

The present invention should be more effective especially if the permanent magnets 16a, 16b are rare-earth magnets such as neodynium magnets which have greater magnetism and therefore more apt to draw magnetic objects.

It should be noted here that for easy transportation, the generator 10 may have its upper surface mounted with hooks (not illustrated) fixed with bolts for example. This makes the generator 10 easily lifted at the hooks by a crane or other hoisting equipment.

It should also be noted here that according to the above embodiment, the stud pins 30 are used to keep the shielding members 34 off the main body 12 out of reach of the magnetic force F. However, the stud pins 30 may not be used, and the plate yokes 14a, 14b may be directly attached with the shielding members 34 if the shielding members 34 are sufficiently away from the strong magnetic field generated by the permanent magnets 16a, 16b, so that magnetic objects placed outward of the shielding members 34 are not drawn in.

Figure 6:
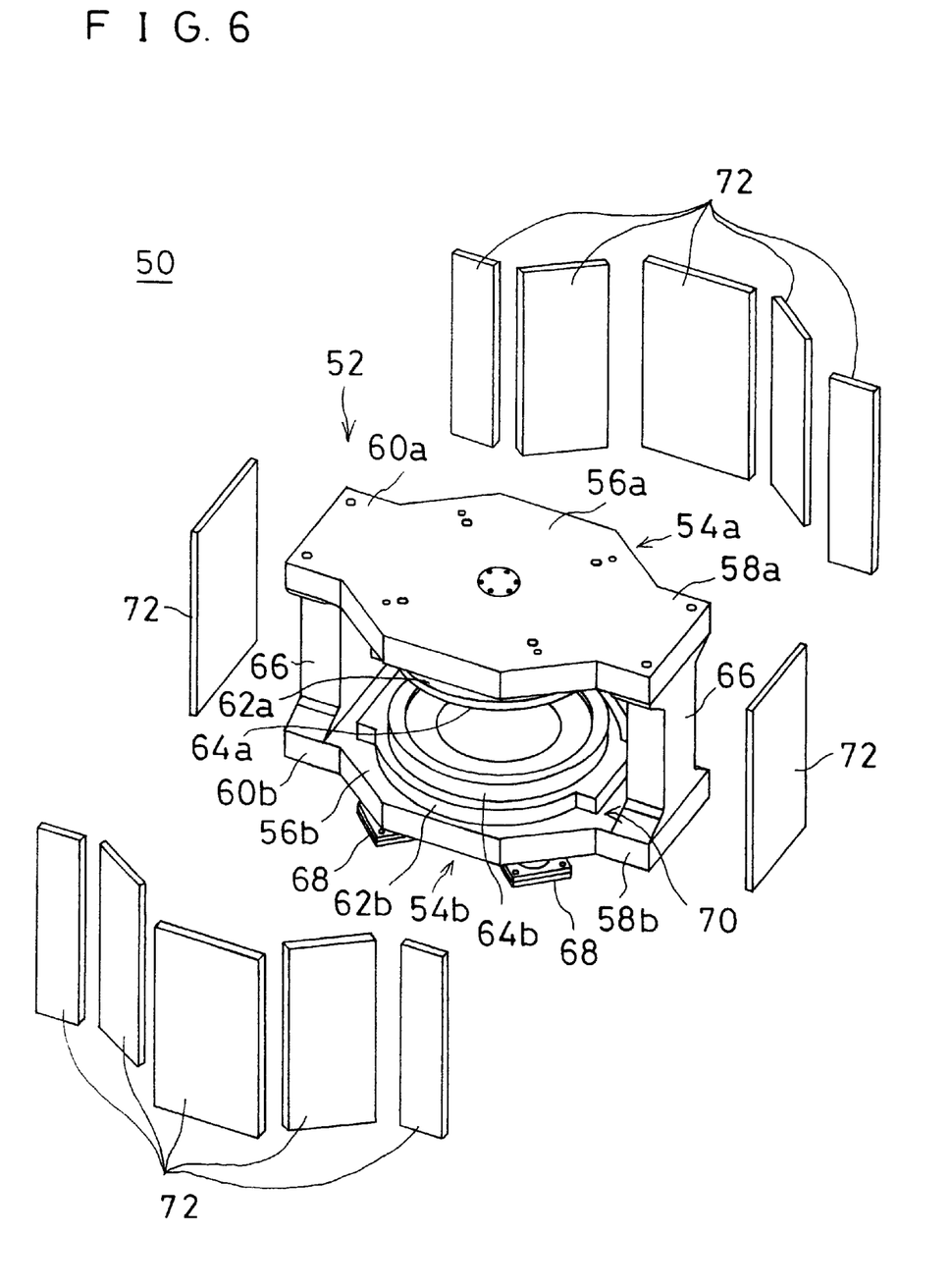
FIG. 6 is a perspective explosive view of another embodiment of the present invention, showing a state before packing.

Next, FIG. 6 shows a magnetic field generator for MRI 50 as another embodiment of the present invention.

The generator 50 comprises a generator main body 52. The main body 52 includes a pair of plate yokes 54a, 54b opposed to each other with space in between. The plate yoke 54a includes a generally octagonal main portion 56a, and a pair of connecting portions 58a, 60a each formed at an end of the main portion 56a. Likewise, the plate yoke 54b includes a generally octagonal main portion 56b, and a pair of connecting portions 58b, 60b each formed at an end of the main portion 56b.

The plate yokes 54a, 54b are opposed to each other. The opposed surfaces are respectively provided with permanent magnets 62a, 62b similarly to the generator 10 in FIG. 1. The permanent magnets 62a, 62b are respectively fixed with pole pieces 64a, 64b which are opposed to each other. The pair of plate yokes 54a, 54b are magnetically connected with each other by a pair of generally I-shaped column yokes 66. The lower plate yoke 54b has a lower surface provided with leg portions 68.

With the above arrangements, the main body 52 has an opening 70 formed by the plate yokes 54a, 54b and the column yokes 66. In order to shield the opening 70, packing members including a set of shielding members 72 each made of a generally rectangular plate are prepared. Each of the shielding members 72 is prepared to fit a corresponding portion of the opening 70. According to this embodiment, a total of twelve shielding members 72 made of rectangular plates are prepared.

Figure 7:
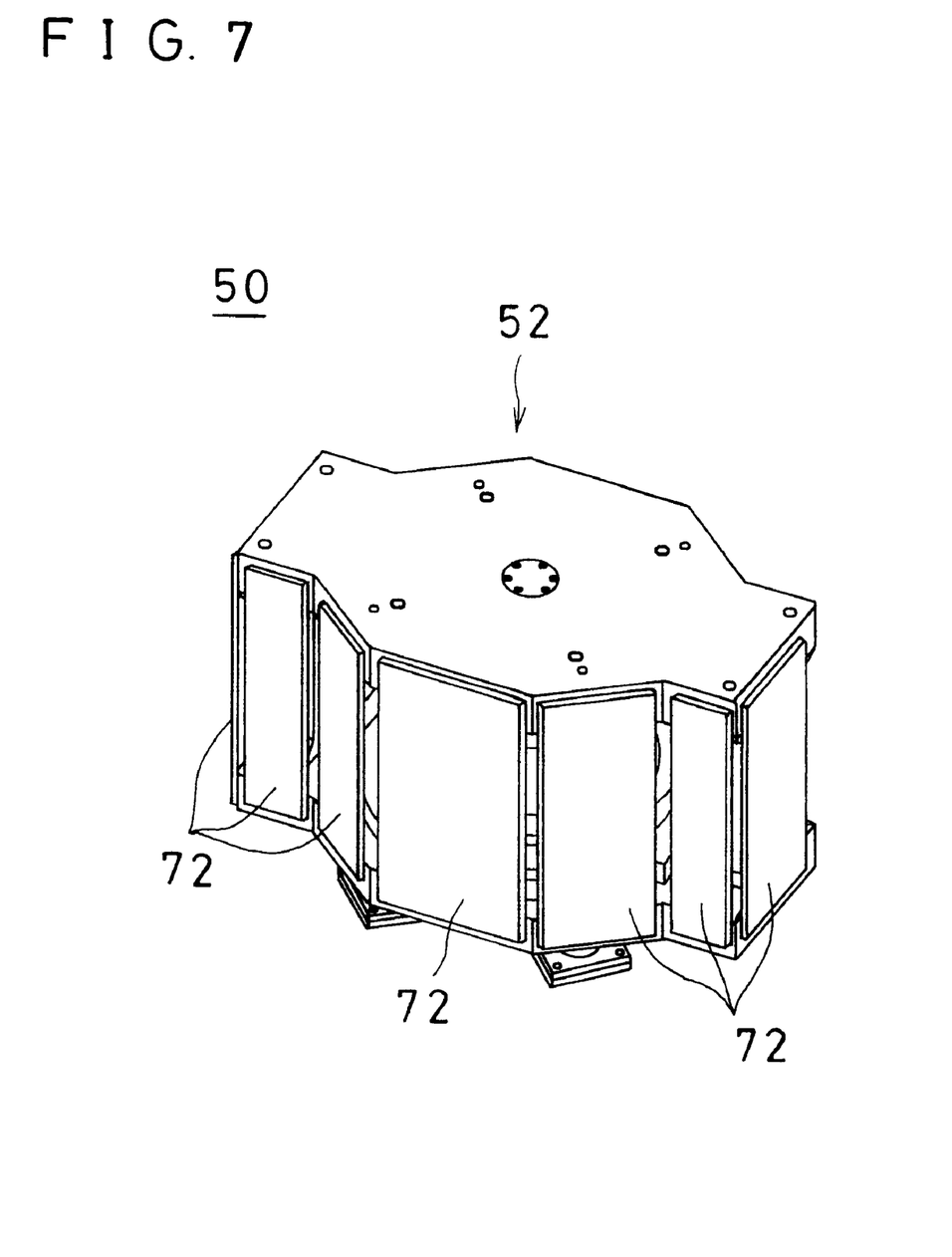
FIG. 7 is a perspective view of the embodiment in FIG. 6, showing a state after the packing.

The opening 70 of the main body 52 is shielded as shown in FIG. 7 when each of the shielding members 72 has been attached to bridge the plate yokes 54a, 54b. The attachment of the shielding members 72 for bridging respective side surfaces of the plate yokes 54a, 54b may be made by any known method of fastening such as bolting, bonding, or others.

According to the above type of magnetic field generator for MRI 50 shown in FIGS. 6 and 7, the shielding members 72 are far away enough from a strong magnetic field. Thus, differing from the case for the generator 10 shown in FIG. 1, the shielding members 72 may be attached directly to the plate yokes 54a, 54b without the stud pins 30.

The magnetic field generator for MRI 50 provides the same advantages as those provided by the magnetic field generator for MRI 10 shown in FIG. 1.

Figure 8:
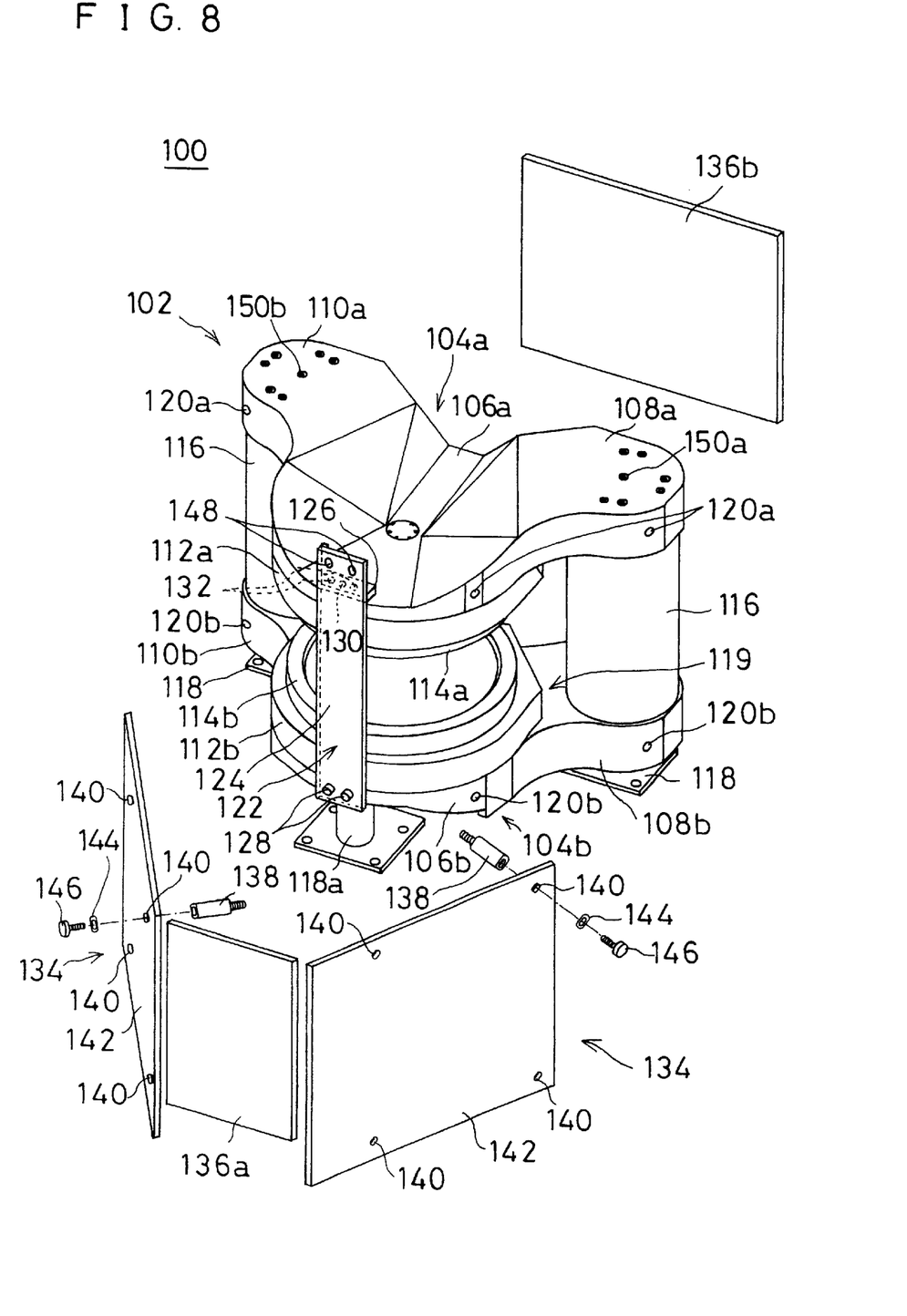
FIG. 8 is a perspective explosive view of still another embodiment of the present invention, showing a state before packing.

Next, FIG. 8 shows a magnetic field generator for MRI 100 as still another embodiment of the present invention.

The generator 100 is an open-type unit, and comprises a generator main body 102.

The main body 102 includes a pair of plate yokes 104a, 104b opposed to each other with space in between. The plate yoke 104a includes a generally disc-shaped main portion 106a, and a pair of connecting portions 108a, 110a each extending from the main portion 106a. Likewise, the plate yoke 104b includes a generally disc-shaped main portion 106b, and a pair of connecting portions 108b, 110b each extending from the main portion 106b.

Similarly to the previous embodiments, the main portion 106a of the plate yoke 104a and the main portion 106b of the plate yoke 104b are opposed to each other, and the opposed surfaces are respectively provided with permanent magnets 112a, 112b. Likewise, the permanent magnets 112a, 112b are respectively fixed with pole pieces 114a, 114b which are opposed to each other. The pair of plate yokes 104a, 104b are magnetically connected with each other by a pair of cylindrical column yokes 116. One of the column yokes 116 is disposed between the connecting portions 108a and 108b, while the other, between the connecting portions 110a and 110b.

Further, the lower plate yoke 104b has a lower surface provided with leg portions 118 at locations corresponding to the pair of column yokes 116 respectively. In addition, the lower surface of the lower plate yoke 104b is further provided with another leg portion 118a at an equidistant location from each of the two column yokes 116, corresponding to a middle point of an opening 119.

Each of the plate yokes 104a, 104b has a front-facing side surface formed with threaded hole 120a or 120b for accepting stud pins 138 (to be described later). According to this embodiment, each of the plate yokes 104a, 104b is formed with a total of four threaded holes 120a, 120b.

With the above arrangements, the opening 119 formed by the plate yokes 104a, 104b and the column yokes 116 is shielded by a set of packing members in the following steps.

First, a fixing member 122 is attached to a location where the leg portion 118a is provided, i.e. at the middle point of the opening 119, bridging the plate yokes 104a, 104b. By providing the fixing member 122 to this location, it becomes possible to better protect the plate yokes 104a, 104b from being out of alignment. The fixing member 122 is made of a metal for example, including a strip-shaped main portion 124 and a tab portion 126 attached vertically to the main portion 124 closer to a top end of the main portion 124. The main portion 124 has a lower end portion fixed to the side surface of the plate yoke 104b by bolts 128. On the other hand, the tab portion 126 is fixed to an upper surface of the plate yoke 104a by a pushing bolt 130 and fixing bolts 132 for holding the plate yoke 104a in position.

Next, in this embodiment, two forward-facing sides of the main body 102 are shielded each by a packing member 134 whereas the front face and the back face of the main body 102 are respectively shielded by unique packing members, i.e. rectangular shielding members 136a and 136b.

It should be appreciated that in order to avoid complexity FIG. 8 does not show every piece of components. Similarly to the packing members 26 shown in FIG. 1, each of the packing members 134 includes stud pins 138, a generally rectangular shielding member 142 formed with holes 140, washers 144, and fixing bolts 146. The stud pins 138, the holes 140, washers 144 and the fixing bolts 146 included in each of the packing members 134 are prepared to fit respective corresponding threaded holes 120a, 120b. According to this embodiment, four of each are prepared per the packing member 134. Each of the stud pins 138 has exactly the same construction as the stud pin 30 shown in FIG. 3, and the packing members 134 are attached in exactly the same way as the packing members 26 shown in FIG. 1. Thus, no further detailed description will be repeated here.

The shielding members 136a, 136b are far away enough from the strong magnetic field. Thus, the shielding members 136a, 136b may be attached directly without the stud pins 138. Specifically, the shielding member 136a may be attached to cover the fixing member 122, and the shielding member 136b may be attached to a back face of the main body 102 respectively by any known method of fastening such as bolting, bonding, or others.

Figure 9:
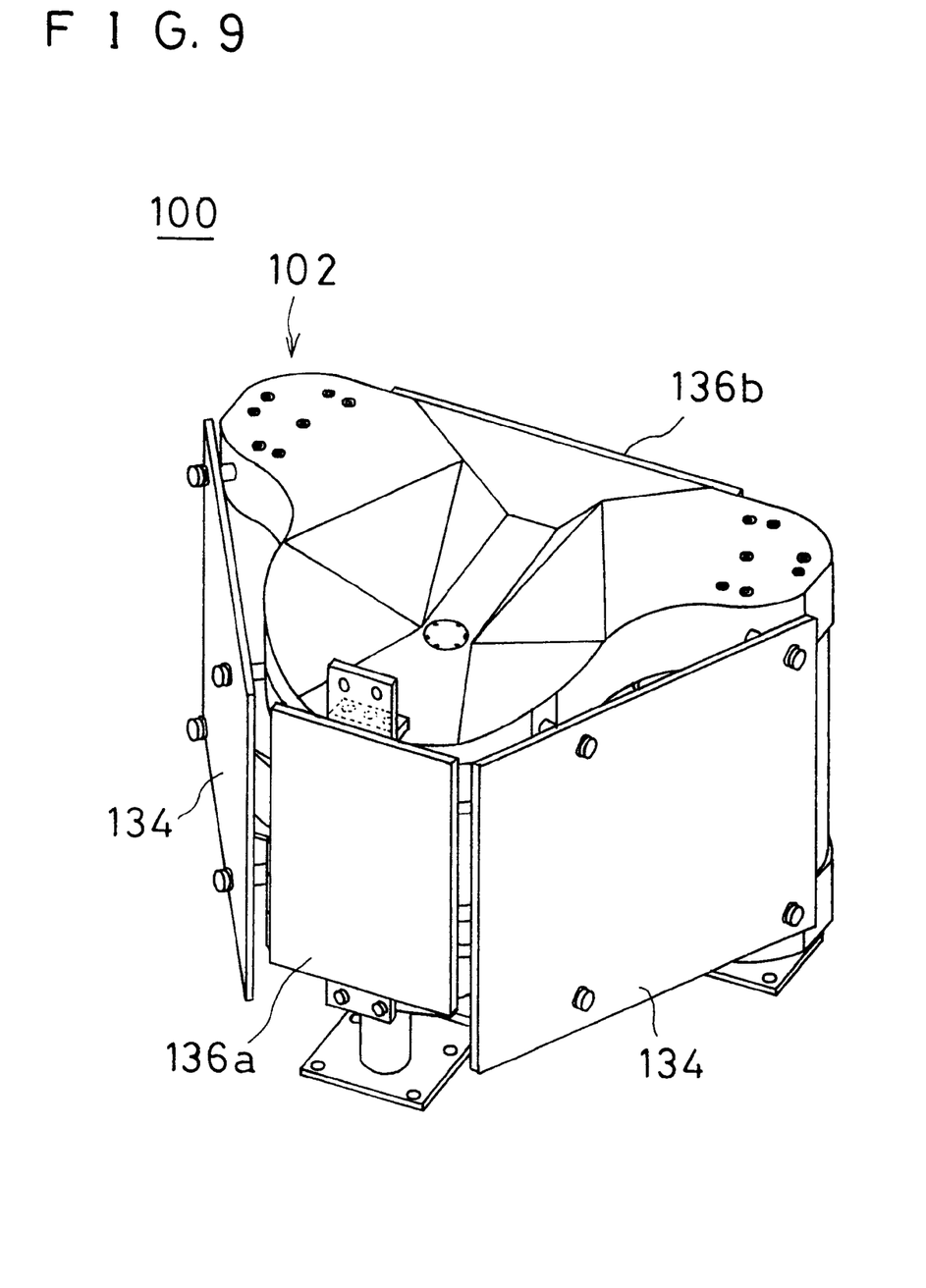
FIG. 9 is a perspective view of the embodiment in FIG. 8, showing a state after the packing.

The attaching operation of the packing members to the main body 102 is thus complete as shown in FIG. 9.

The magnetic field generator for MRI 100 attached with the above packing members provides the same advantages as those provided by the magnetic field generator for MRI 10 shown in FIG. 1. In addition, the fixing member 122 attached for bridging the plate yokes 104a, 104b holds in position the plate yokes 104a, 104b against impacts during the time of crane operation or transportation. This protects the magnetic circuit of the generator 100 from dimensional change, thereby minimizing deterioration of the magnetic field uniformity. Thus, it becomes possible to reduce steps for re-adjusting the magnetic field after the transportation, reduce the time for re-adjustment, making possible to easily obtain image of high quality.

It should be noted here that for easy transportation, the fixing member 122 may be formed with two hooking holes 148 for example at its upper end portion, whereas the connecting portions 108a, 110a of the plate yoke 104a may be formed with hook fixing holes 150a, 150b in their respective upper surfaces. These holes 148, 150a, 150b can facilitate lifting operation of the generator 100 by a crane for example.

It should also be noted here that the fixing member 122 may be attached elsewhere than to a middle portion of the opening 119, as far as the attachment is made bridging the plate yokes 104a and 104b. Further, a plurality of the fixing members 122 may be attached to bridge the plate yokes 104a and 104b. In such a case, however, the attachment should preferably be made at a constant interval between the two column yokes 116, i.e. in such a way to divide equally the distance between the two column yokes 116.

Figure 10:
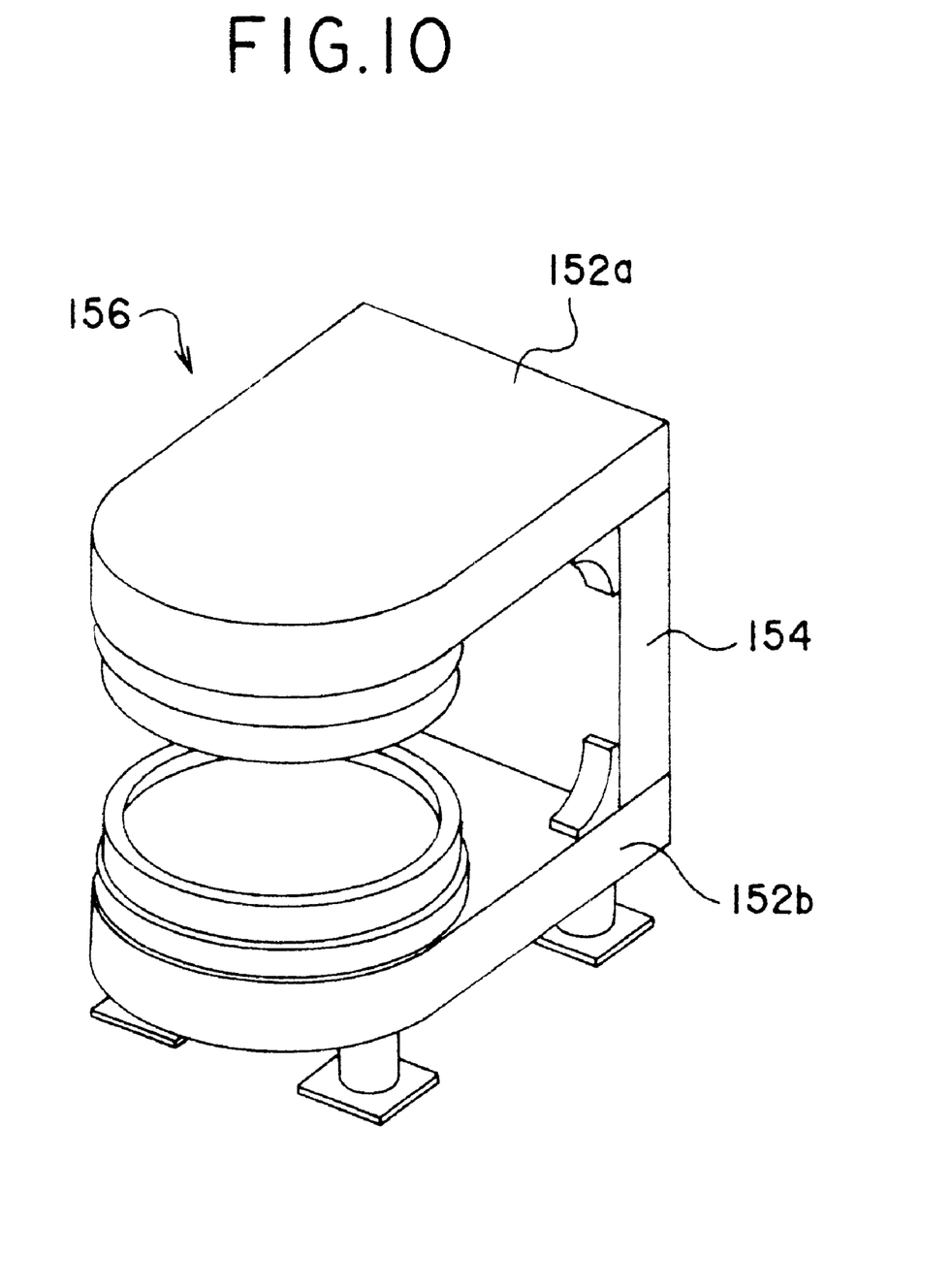
FIG. 10 is a perspective view showing a variation of the generator main body.

The components such as the fixing member 122, packing members 134, and shielding members 136a are also applicable to a magnetic field generator for MRI comprising a generator main body 156 in which a pair of plate yokes 152a, 152b are connected by a single column yoke 154 as shown in FIG. 10.

The shielding members may not only be made of plywood, but also made of plastic material, aluminum, stainless steel or others, as far as the material is non-magnetic and has appropriate strength.

Throughout the above embodiments, description has been made only for cases where only the side surfaces of the generator main body are attached with the packing members. However, the upper surface of the generator main body may also be attached with the packing members so the generator main body can be enclosed in its entirety.

Further, according to the above embodiments, the stud pins are used as a gap providing member. However, the present invention is not limited by the above, and any type of threaded bolts capable of providing the gap G between the generator main body and the packing member is appropriate.

Further, according to the above embodiments, the packing members are attached to bridge the plate yokes. However, the present invention is not limited by the above, and the packing members may be attached to bridge adjacent two column yokes instead.

Still further, the present invention is also applicable to an MRI apparatus as a completed product because the present invention solves exactly the same problems associated with the completed MRI apparatus as the problems associated with the magnetic field generator for MRI.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetic field generator for MRI comprising:
   a generator main body including a pair of plate yokes opposed to each other with space in between, a magnet disposed in each of the opposed surfaces of the pair of plate yokes, and a column yoke for magnetically connecting the plate yokes; and
   a shielding member attached to at least one of the plate yokes and the column yoke for shielding an opening formed by the pair of plate yokes and the column yoke, for prevention of a magnetic object from being drawn inside the magnetic field generator, the shielding member being removable after the magnetic field generator is transported to a destination thereof.

2. The generator according to claim 1,
   further comprising a gap providing member for providing a gap between the generator main body and the shielding member,
   wherein the gap providing member has an end portion for attachment to the generator main body so as to protrude laterally outwardly of the generator main body, and another end portion for attachment by the shielding member.

3. A magnetic field generator for an open-type MRI, comprising:
   a generator main body including a pair of plate yokes opposed to each other with space in between, a magnet disposed in each of the opposed surfaces of the pair of plate yokes, and a column yoke for magnetically connecting the plate yokes; and
   a fixing member provided at an opening formed by the plate yokes and the column yoke, for holding in place the pair of plate yokes,
   wherein the fixing member bridges the pair of plate yokes, the fixing member being removable after the magnetic field generator is transported to a destination thereof.

4. A packing member for a magnetic field generator for MRI, the magnetic field generator comprising a generator main body including a pair of plate yokes opposed to each other with space in between, a magnet disposed in each of the opposed surfaces of the pair of plate yokes, and a column yoke for magnetically connecting the plate yokes, wherein the packing member includes a shielding member attached to at least one of the plate yokes and the column yoke for shielding an opening formed by the pair of plate yokes and the column yoke, for prevention of a magnetic object from being drawn inside the magnetic field generator, the shielding member being removable after the magnetic field generator is transported to a destination thereof.

5. The packing member according to claim 4, wherein the packing member further includes a gap providing member for providing a gap between the generator main body and the shielding member, and wherein the gap providing member has an end portion for attachment to the generator main body so as to protrude laterally outwardly of the generator main body, and another end portion for attachment by the shielding member.

6. A packing member for a magnetic field generator for an open-type MRI, the magnetic field generator comprising a generator main body including a pair of plate yokes opposed to each other with space in between, a magnet disposed in each of the opposed surfaces of the pair of plate yokes, and a column yoke for magnetically connecting the plate yokes, wherein the packing member includes a fixing member provided at an opening formed by the plate yokes and the column yoke, for holding in place the pair of plate yokes, wherein the fixing member bridges the pair of plate yokes, the fixing member being removable after the magnetic field generator is transported to a destination thereof.

7. A method for packing a magnetic field generator for MRI, the magnetic field generator having a generator main body including a pair of plate yokes opposed to each other with space in between, a magnet disposed in each of the opposed surfaces of the pair of plate yokes, and a column yoke for magnetically connecting the plate yokes, the method comprising:

a first step of preparing a shielding member; and a second step of attaching the shielding member to the generator main body to shield an opening formed by the pair of plate yokes and the column yoke, the shielding member being removable after the magnetic field generator is transported to a destination thereof.

8. The method according to claim 7, wherein the first step includes a sub-step of preparing a gap providing member for providing a gap between the generator main body and the shielding member, and wherein the second step includes sub-steps, if the shielding member is attached within a strong magnetic field, of attaching an end portion of the gap providing member to the generator main body so that the gap providing member protrudes laterally outwardly of the generator main body, and of attaching the shielding member to another end portion of the gap providing member.

9. The generator according to claim 3, wherein the fixing member is attached to a center portion of the opening.

10. A method for packing a magnetic field generator for an open-type MRI, wherein the magnetic field generator comprises a generator main body including a pair of plate yokes opposed to each other with space in between, a magnet disposed in each of the opposed surfaces of the pair of plate yokes, and a column yoke for magnetically connecting the plate yokes, the method comprising:

a first step of preparing a fixing member; and a second step of providing the fixing member at an opening formed by the pair of plate yokes and the column yoke and attaching the fixing member for bridging the pair of plate yokes, the fixing member being removable after the magnetic field generator is transported to a destination thereof.

* * * * *